United States Patent [19]
Linliu

[11] Patent Number: 6,037,217
[45] Date of Patent: Mar. 14, 2000

[54] METHOD OF FABRICATING A CAPACITOR ELECTRODE STRUCTURE IN A DYNAMIC RANDOM-ACCESS MEMORY DEVICE

[75] Inventor: Kung Linliu, Hsinchu, Taiwan

[73] Assignee: Worlwide Semiconductor Manufacturing Corp., Hsinchu, Taiwan

[21] Appl. No.: 09/250,372

[22] Filed: Feb. 16, 1999

[30] Foreign Application Priority Data

Nov. 16, 1998 [TW] Taiwan ................................. 87118920

[51] Int. Cl.⁷ ................................................. H01L 21/8242
[52] U.S. Cl. .......................................... 438/253; 438/254
[58] Field of Search ................................. 438/238–242, 438/250–256, 381, 393–399

[56] References Cited

U.S. PATENT DOCUMENTS 5,874,335  2/1999  Jenq ........................................ 438/253
5,918,122  6/1999  Parekh et al. ........................... 438/253

*Primary Examiner*—Jey Tsai
*Attorney, Agent, or Firm*—Thomas, Kayden, Horstemeyer & Risley

[57] ABSTRACT

An integrated circuit (IC) fabrication method is provided for the fabrication of an electrode structure having an increased surface area for a double-crown type of capacitor in a dynamic random-access memory (DRAM) device. In this method, damascene technology is used, which can help reduce the height difference between the memory cell region and the peripheral region, thus eliminating the required planarization process in the prior art. Moreover, this method can provide an electrode structure having a large surface area that allows the associated capacitor to be considerably increased in capacitance as compared to the prior art while requiring no increase in the layout area in the integrated circuit.

13 Claims, 6 Drawing Sheets

METHOD OF FABRICATING A CAPACITOR ELECTRODE STRUCTURE IN A DYNAMIC RANDOM-ACCESS MEMORY DEVICE

CROSS-REFERENCE TO RELATED APPLICATION

This application claims the priority benefit of Taiwan application serial no. 87118920, filed Nov. 16, 1998, the full disclosure of which is incorporated herein by reference.

BACKGROUND OF THE INVENTION

1. Field of the Invention:

This invention relates to integrated circuit (IC) fabrication technology, and more particularly, to a method of fabricating an electrode structure having an increased surface area for a double-crown type of capacitor in a dynamic random-access memory (DRAM) device.

2. Description of Related Art:

In IC fabrication, the primary goal is to make the resulting IC device as highly integrated as possible. To achieve this goal, the various semiconductor components in the IC device should be sized as small as possible in accordance with the design rules. In the case of DRAM, however, the downsizing of the device would also reduce the size of its data storage capacitor, and hence reduce the capacitance of the capacitor, resulting in a reduced data retaining capability by the capacitor. A DRAM capacitor with a smaller capacitance would require more frequent refreshing of the data stored therein, and thus would be more power consumptive and less reliable to operate. One solution to increase the capacitance is to use a capacitor called a stacked capacitor, in which the electrodes are formed in a stacked manner with a special dielectric film sandwiched therebetween. This type of capacitor, however, is still provides inadequate capacitance.

Another solution is to use a capacitor known as a trench-type capacitor, in which a trench structure with a thin dielectric film is formed to provide an increased surface area for the electrodes. This solution, however, would cause low yield rate and low reliability in DRAM production.

Presently, many 3-dimensional types of capacitors have been proposed to increase the capacitance of the DRAM capacitor. One example is U.S. Pat. No. 5,399,518, granted to Sim et al., which discloses a method for fabricating a double-cylindrical type of capacitor. In this capacitor, the electrode is formed in a double-cylindrical shape including an inner cylindrical structure and an outer cylindrical structure to allow a large surface area for the electrode to provide an increased capacitance.

Another example is U.S. Pat. No. 5,443,993, granted to Part et al., which discloses another method for fabricating a double-cylindrical type of capacitor through the formation of a provisional insulating spacer structure that is later removed to provide the desired electrode structure.

Moreover, U.S. Pat. No. 5,491,103, granted to Aho et al., discloses another method for fabricating a double-cylindrical type of capacitor, which is characterized in the use of low-temperature oxide as a sidewall structure to the photoresist layer for the purpose of preventing the photoresist layer from being deformed during the process.

Even further, U.S. Pat. No. 5,438,013, granted to Kim et al., discloses another method for fabricating a double-cylindrical type of capacitor, which is characterized in the use of controlled undercut to form a double-sidewall mask used to define the electrodes.

As to the stacked capacitor, its capacitance can be increased by increasing the height of the stacked cells in the memory cell region of the DRAM device. One drawback to this solution, however, is that, when the stacked cells are higher than the peripheral region of the DRAM device, cell planarization and the forming of metal interconnects are more difficult to carry out. Therefore, at the deep-submicron level of integration, there still exists a need for a new method for the fabrication of a DRAM capacitor having a large capacitance.

SUMMARY OF THE INVENTION

It is therefore an objective of the present invention to provide a method of fabricating a capacitor electrode structure in DRAM, which can help reduce the height difference between the memory cell region and the peripheral region so that planarization is unnecessary to simply the overall process complexity.

It is another objective of the present invention to provide a method of fabricating a capacitor electrode structure in DRAM, which can help allow the associated capacitor to be considerably increased in capacitance as compared to the prior art while requiring no increase in the layout area in the integrated circuit.

In accordance with the foregoing and other objectives of the present invention, a new semiconductor fabrication method is provided for fabricating a capacitor electrode structure in a DRAM device. The DRAM device is constructed on a semiconductor substrate already formed with a MOSFET having a first source/drain region and a second source/drain region, with the capacitor electrode structure being defined to be electrically connected to the first source/drain region. By the method of the invention, a first insulating layer is formed over the MOSFET; then a capacitor-node contact window and a bit-line contact window are formed in the first insulating layer, with the capacitor-node contact windows exposing the first source/drain region and the bit-line contact window exposing the second source/drain region. Next, a second polysilicon layer is formed over the first polysilicon layer, which fills the capacitor-node contact windows and the bit-line contact window; a metal silicide layer is formed over the second polysilicon layer; and a second insulating layer is formed over the metal silicide layer. Subsequently, an anisotropic etching process is performed to remove selected portions of the second insulating layer, the metal silicide layer, the second polysilicon layer, the first polysilicon layer, and the polysilicon-based sidewall structure other than those portions that lie directly above the second source/drain region. The remaining portions in combination constitute a bit-line structure connected to the second source/drain region. After this, a first insulating sidewall structure is formed on the sidewall of each bit-line structure. Next, a third insulating layer is formed to cover the bit-line structure, with the third insulating layer being formed with an opening directly above the first source/drain region. A third polysilicon layer is then formed over the third insulating layer, with the third polysilicon layer being conformal to the third insulating layer and coming into contact with the second polysilicon layer in the capacitor-node contact window. Subsequently, a fourth insulating layer is formed over the third polysilicon layer, with the fourth insulating layer being conformal to the third polysilicon layer; and a fourth polysilicon layer is formed over the fourth insulating layer with the fourth polysilicon layer being conformal to the fourth insulating layer. After this, a second insulating sidewall structure is formed on the fourth polysilicon layer. Next, with the second insulating sidewall structure serving as mask, an anisotropic etching process is performed to remove the exposed part of the fourth polysilicon layer and part of the fourth insulating layer until exposing the third polysilicon layer. Then, a fifth polysilicon layer is formed in such a manner as to fill up the opening enclosed by the second insulating sidewall structure and come into contact with the fourth polysilicon layer and the third polysilicon layer. An anisotropic etching process is then performed to remove selected portions of the fifth polysilicon layer, the fourth polysilicon layer, and the third polysilicon layer until exposing the third insulating layer. Finally, an isotropic etching process, such as a wet-etching process, is performed to remove the third insulating layer, the fourth insulating layer, and the second insulating sidewall structure. Through the foregoing process, the fifth polysilicon layer, the fourth polysilicon layer, the third polysilicon layer, and the second polysilicon layer in combination constitute the intended capacitor electrode structure which is connected via the first polysilicon layer to the first source/drain region.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the method according to the invention for fabricating a capacitor electrode structure for a double-cylindrical type of capacitor in a DRAM device is disclosed in full details in the following with reference to FIGS. 1A–1M.

Typically, the layout of a DRAM device is partitioned into a memory cell region and a peripheral region. The memory cell region is used to form a MOSFET (metal-oxide semiconductor field effect transistor) device and a data-storage capacitor, while the peripheral region is used to form a CMOS (complementary metal-oxide semiconductor) device. Since the circuit in the peripheral region is not within the spirit and scope of the invention, the following description will be directed only to the fabrication of a capacitor electrode structure in the memory cell region.

Figure 1A:
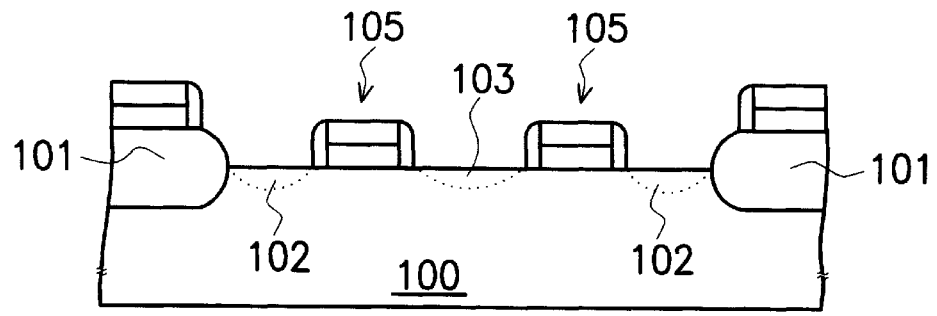
FIGS. 1A–1M are schematic sectional diagrams used to depict the steps involved in the method of the invention for fabricating a capacitor electrode structure in a DRAM device.

Referring first to FIG. 1A, a semiconductor substrate 100, such as a P-type silicon substrate, is prepared. A plurality of isolation structures 101, such as field oxide layers or shallow-trench isolation (STI) structures, are formed at predefined locations in the substrate 100 to define active regions. In each active region, a plurality of transistor elements, such as N-type MOSFETs 105, is formed. Each MOSFET 105 is composed of a gate structure and a pair of source/drain regions 102, 103. The first source/drain region 102 is to be connected to the intended capacitor electrode, while the second source/drain region 103 is to be connected to a bit line.

Figure 1B:
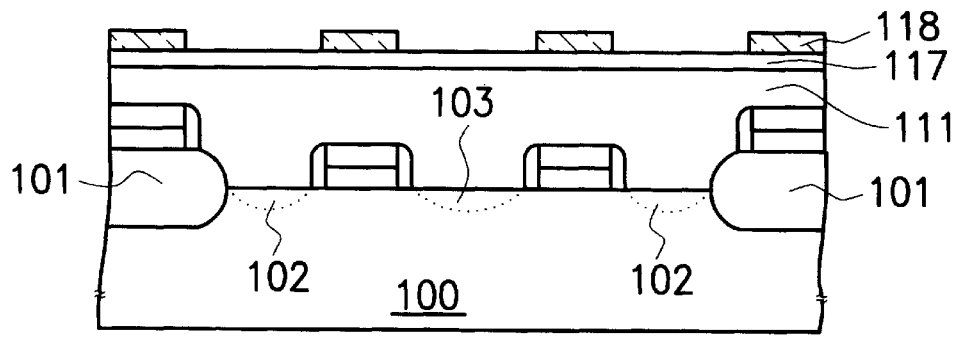

Referring next to FIG. 1B, in the subsequent step, an insulating layer 111 is formed, preferably from oxide or borophosphosilicate glass (BPSG), over the entire top surface of the wafer, covering all the currently formed components over the substrate 100. Next, a planarization process is performed on the insulating layer 111 to planarize the top surface of the insulating layer 111. Subsequently, a polysilicon layer 117 is formed over the insulating layer 111, preferably through a low-pressure chemical-vapor deposition (LPCVD) process to a thickness of from 500 Å to 1,500 Å (angstrom). After this, a photoresist layer 118 is formed over the polysilicon layer 117 in such a manner as to expose those areas of the polysilicon layer 117 that lie directly above the source/drain regions 102, 103.

Figure 1C:
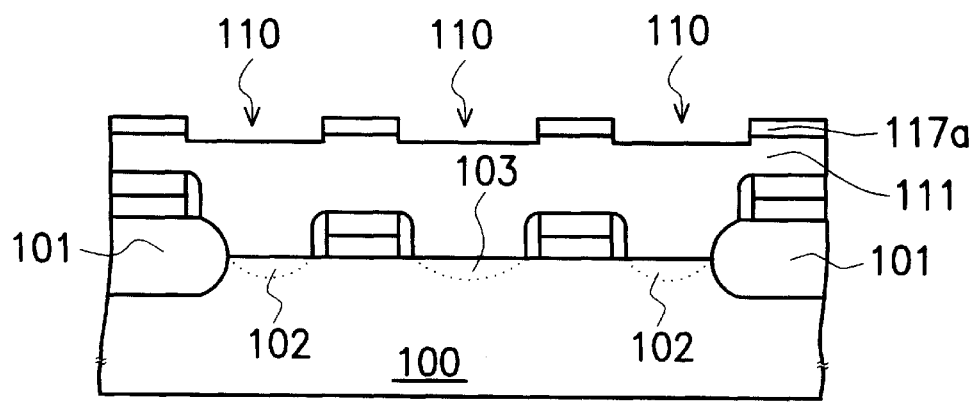

Referring next to FIG. 1C, in the subsequent step, with the photoresist layer 118 serving as mask, an anisotropic etching process is performed to etch away all the exposed portions of the polysilicon layer 117. To ensure that all the exposed portions of the polysilicon layer 117 can be entirely removed, the etching process is performed in such a manner as to overly etch into the insulating layer 111 to a controlled depth. Through this process, a plurality of openings 110 is formed in the polysilicon layer 117. The remaining part of the polysilicon layer 117 is here designated by the reference numeral 117a, while the remaining part of the insulating layer 111 is here designated by the reference numeral 111a for distinguishing purpose. After this, the entire photoresist layer 118 is removed.

Figure 1D:
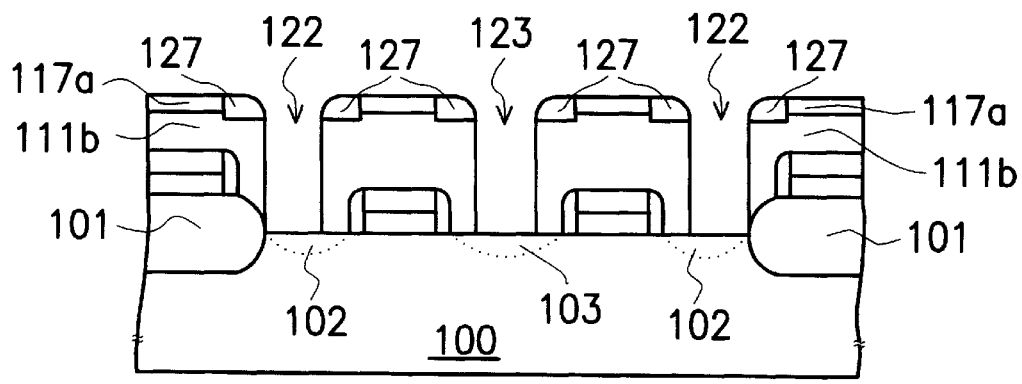

Referring further to FIG. 1D, in the subsequent step, polysilicon-based sidewall structures 127 are formed on the sidewalls of the openings 110 in the polysilicon layer 117a. These polysilicon-based sidewall structures 127 can be formed by, for example, first depositing polysilicon over the entire top surface of the wafer to form a conformal polysilicon layer, and then performing an anisotropic etching process on the polysilicon layer until the top surface of insulating layer 111a is exposed. Then, with the polysilicon layer 117a and the polysilicon-based sidewall structures 127 together serving as a mask, an anisotropic etching process is performed to etch away the exposed portions of the insulating layer 111a until exposing the source/drain regions 102, 103. Through this process, a plurality of contact windows 122, 123 are formed (in terms of their intended purposes, the contact windows 122 are hereinafter referred to as capacitor-node contact windows, while the contact windows 123 are hereinafter referred to as bit-line contact window). The capacitor-node contact windows 122 expose the first source/drain regions 102, while the bit-line contact window 123 exposes the second source/drain region 103. The remaining part of the insulating layer 111a is here designated by the reference numeral 111b for distinguishing purpose.

In the foregoing process, it is a characteristic feature of the invention that the use of the polysilicon-based sidewall structures 127 can help further miniaturize the capacitor-node contact windows 122 and the bit-line contact window 123 as compared to the prior art. This can make the resulting DRAM device more highly integrated than the prior art.

Figure 1E:
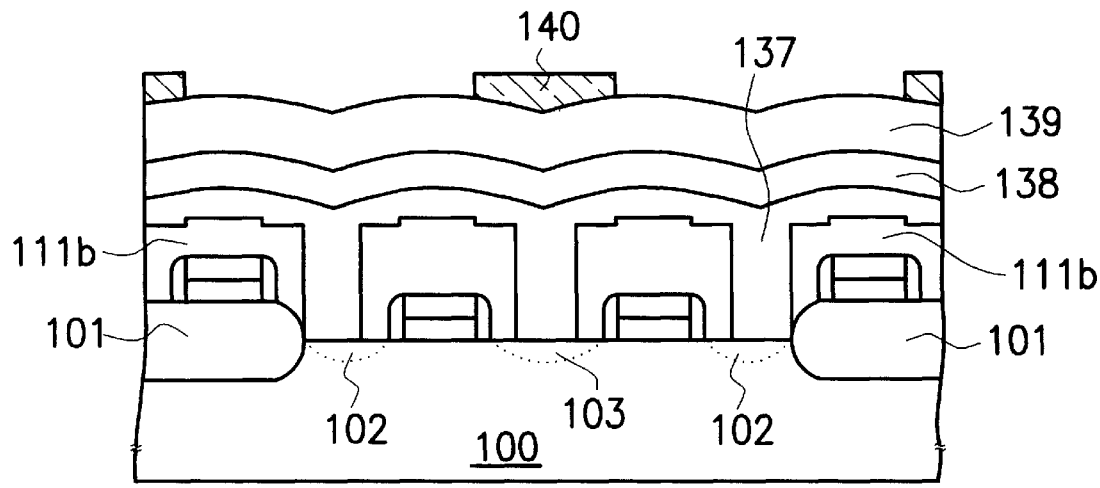

Referring next to FIG. 1E, in the subsequent step, polysilicon is deposited into both of the capacitor-node contact windows 122 and the bit-line contact window 123 and also over the top surface of the wafer. The deposited polysilicon combines with the polysilicon layer 117a and the polysilicon-based sidewall structures 127 to form a single polysilicon-based structure, which is here collectively designated by the reference numeral 137. Next, a metal silicide layer 138 is formed over the polysilicon-based structure 137, preferably from tungsten silicide. Then, an insulating layer 139 is formed over the metal silicide layer 138, preferably from silicon nitride ($SiN_x$). After this, a photoresist layer 140 is formed over the insulating layer 139 in such a manner as to cover the part of the insulating layer 139 that lies directly above the second source/drain region 103.

Up to this stage, the process steps described in FIGS. 1B through 1E are disclosed in U.S. Pat. No. 5,688,713 proposed by the inventors of this application. The advantage of using the patented process is that the capacitor-node contact windows 122 and the bit-line contact window 123 can be formed together through the same process step, and therefore can help simply the overall process and allow a more suitable height-to-width ratio for the capacitor-node contact windows 122 as compared to the prior art.

Figure 1F:
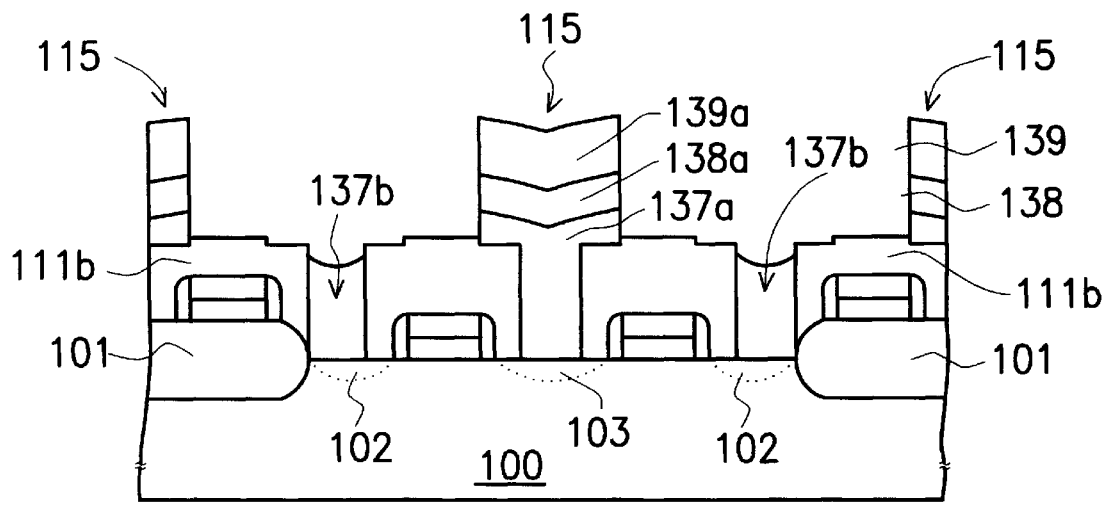

Referring further to FIG. 1F, in the subsequent step, with the photoresist layer 140 serving as mask, an anisotropic etching process is performed to etch away the exposed portions of the insulating layer 139, the metal silicide layer 138, and the polysilicon-based structure 137 until the insulating layer 111b is exposed. The remaining portions of the insulating layer 139 and the metal silicide layer 138 are here respectively designated by the reference numerals 139a, 138a, while the remaining portions of the polysilicon-based structure 137 in the capacitor-node contact windows 122 are here designated by the reference numeral 137b and referred to as a capacitor node plug, and the remaining portion of the same in the bit-line contact window 123 is here designated by the reference numeral 137a and referred to as a bit-line plug. The bit-line plug 137a, the metal silicide layer 138a, and the insulating layer 139a in combination constitute a bit-line structure, as designated by the reference numeral 115, with the bit-line plug 137a and the metal silicide layer 138a serving as a conductive line connected to the second source/drain region 103, and the insulating layer 139a serving as a topping layer to the conductive line.

Figure 1G:
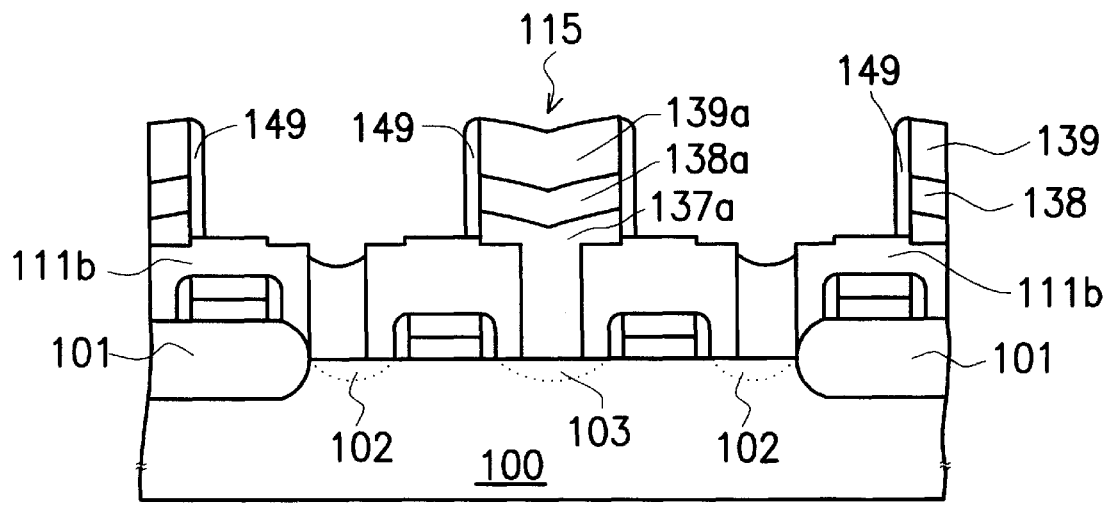

Referring further to FIG. 1G, in the subsequent step, insulating sidewall structures 149 are formed on the sidewalls of the bit-line structure 115. These insulating sidewall structures 149 can be formed by, for example, first depositing silicon nitride ($SiN_x$) over the wafer, and then performing an anisotropic etching process on the deposited silicon nitride until the insulating layer 111b is exposed. The combined structure of the insulating layer 139a and the insulating sidewall structures 149 serves as an electrically insulating structure for the conductive part (i.e., the metal silicide layer 138a and the bit-line plug 137a) of the bit-line structure 115.

Figure 1H:
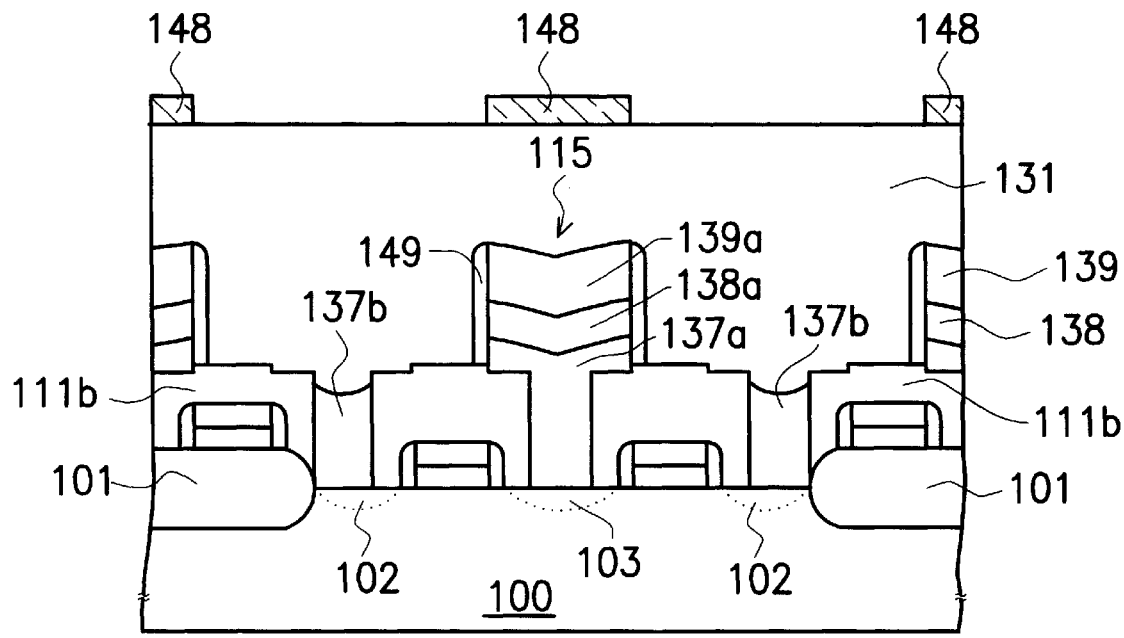

Referring next to FIG. 1H, after the insulating sidewall structures 149 are formed, the subsequent step is to form an insulating layer 131 over the entire top surface of the wafer, preferably from oxide to a thickness substantially equal to the predefined height of the intended electrode structure, preferably from 7,000 Å to 9,000 Å. After this, a photoresist layer 148 is formed over the insulating layer 131 in such a manner as to mask those areas of the insulating layer 131 that lie directly above the bit-line structure 115.

Since the invention utilizes the damascene technology, it can help prevent the height difference between the memory cell region and the peripheral region, thus allowing the subsequent process steps to be easier to carry out as compared to the prior art. In case of a buried type of DRAM, the invention can help reduce the height difference between the memory cell region and the logic circuit region.

Figure 1I:
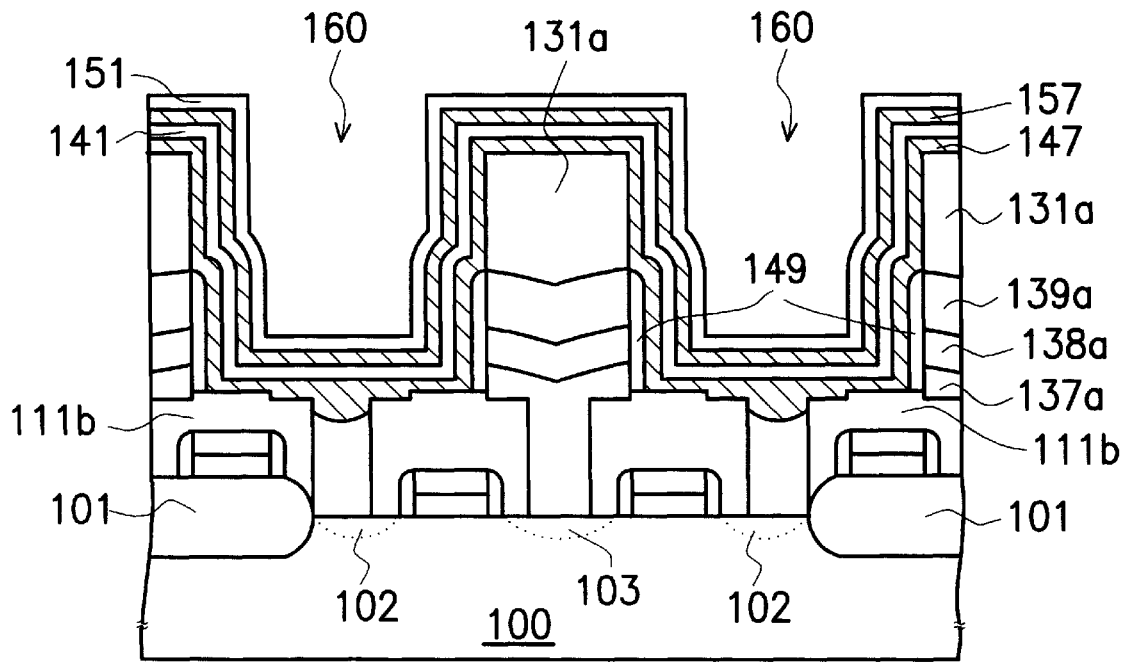

Referring further to FIG. 1I, in the subsequent step, with the photoresist layer 148 serving as mask, an anisotropic etching process is performed to etch away the exposed portions of the insulating layer 131 until the capacitor node plug 137b is exposed, whereby an opening 160 is formed above each of the first source/drain regions 102 (the remaining part of the insulating layer 131 is here designated by the reference numeral 131a for distinguishing purpose). After this, the entire photoresist layer 148 is removed. Subsequently, a conformal polysilicon layer 147 is formed by depositing polysilicon over all the exposed surfaces of the wafer to a predefined thickness of from 400 Å to 700 Å. Next, a conformal insulating layer 141 is formed over the polysilicon layer 147, preferably to a thickness of from 400 Å to 700 Å; then a conformal polysilicon layer 157 is formed over the insulating layer 141, also preferably to a thickness of from 400 Å to 700 Å. After this, a conformal insulating layer 151 is formed over the polysilicon layer 157, preferably to a thickness of from 400 Å to 700 Å.

Figure 1J:
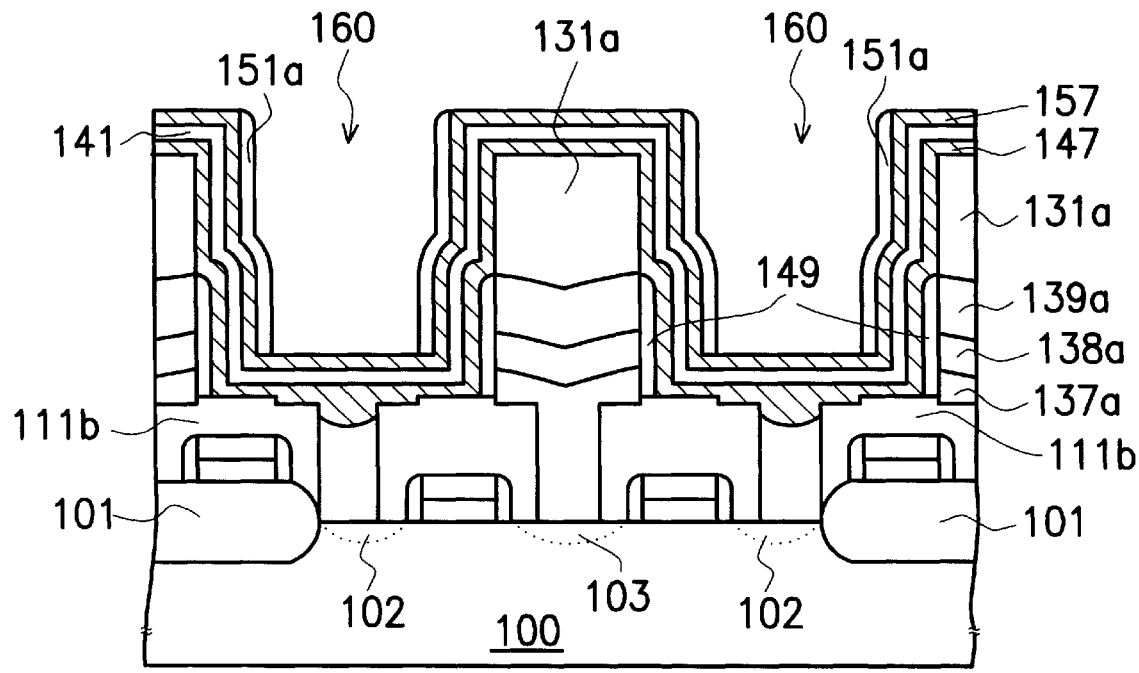

Referring further to FIG. 1J, in the subsequent step, an anisotropic etching process is performed on the insulating layer 151 until exposing the polysilicon layer 157. Through this process, all the portions of the insulating layer 151 that lie directly above the topmost surface of the polysilicon layer 157 are removed (the remaining part of the insulating layer 151 is here referred to as an insulating sidewall structure and designated by the reference numeral 151a for distinguishing purpose).

Figure 1K:
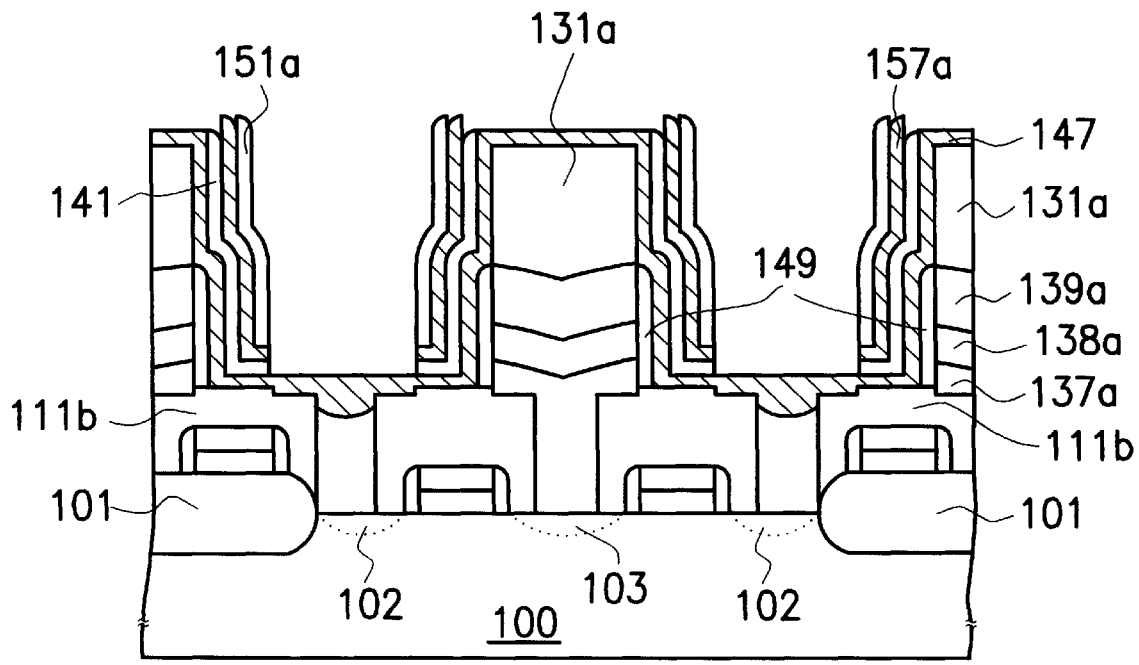

Referring next to FIG. 1K, in the subsequent step, with the insulating sidewall structure 151a serving as mask, an anisotropic etching process is performed to etch away the exposed portions of the polysilicon layer 157 until the insulating layer 141 is exposed (the remaining part of the polysilicon layer 157 is here designated by the reference numeral 157a for distinguishing purposes). Next, with the remaining polysilicon layer 157a and the insulating sidewall structure 151a together serving as a mask, an anisotropic etching process is performed to etch away the exposed portions of the insulating layer 141 until the polysilicon layer 147 is exposed (the remaining part of the insulating layer 141 is here designated by the reference numeral 141a for distinguishing purpose). During this process, the insulating sidewall structure 151a is also be slightly etched away, but this is negligible.

Figure 1L:
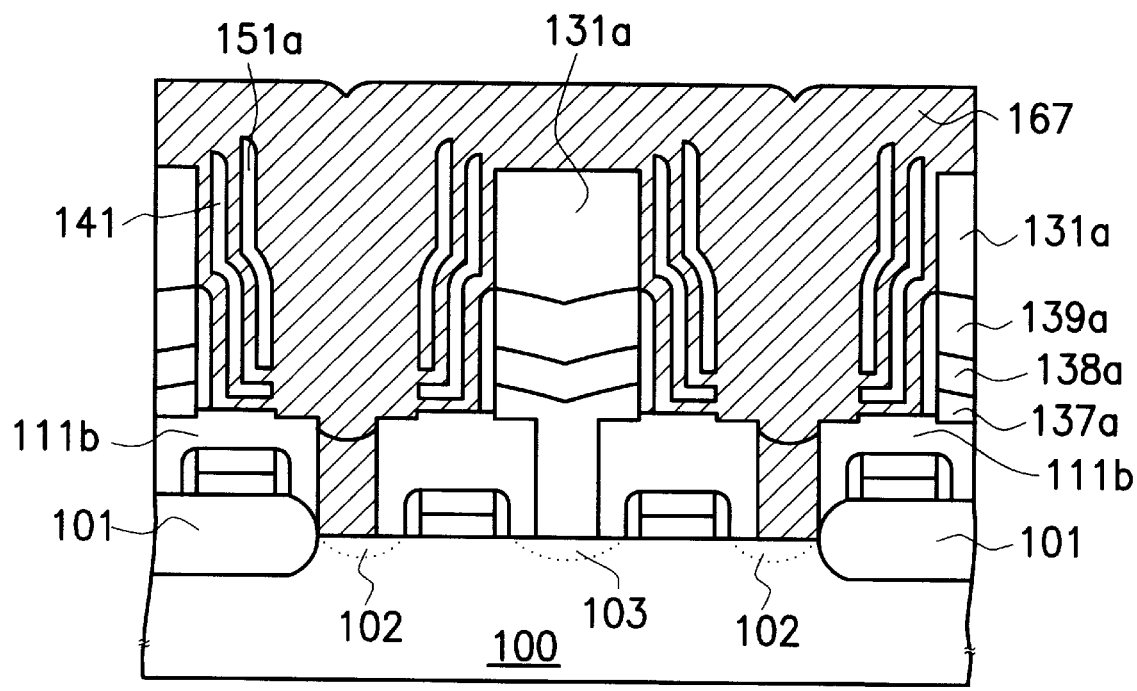

Referring further to FIG. 1L, in the subsequent step, polysilicon is deposited over the wafer. The deposited polysilicon combines with the polysilicon layer 157a and the polysilicon layer 147 to form a single polysilicon-based structure, which is here collectively designated by the reference numeral 167.

Figure 1M:
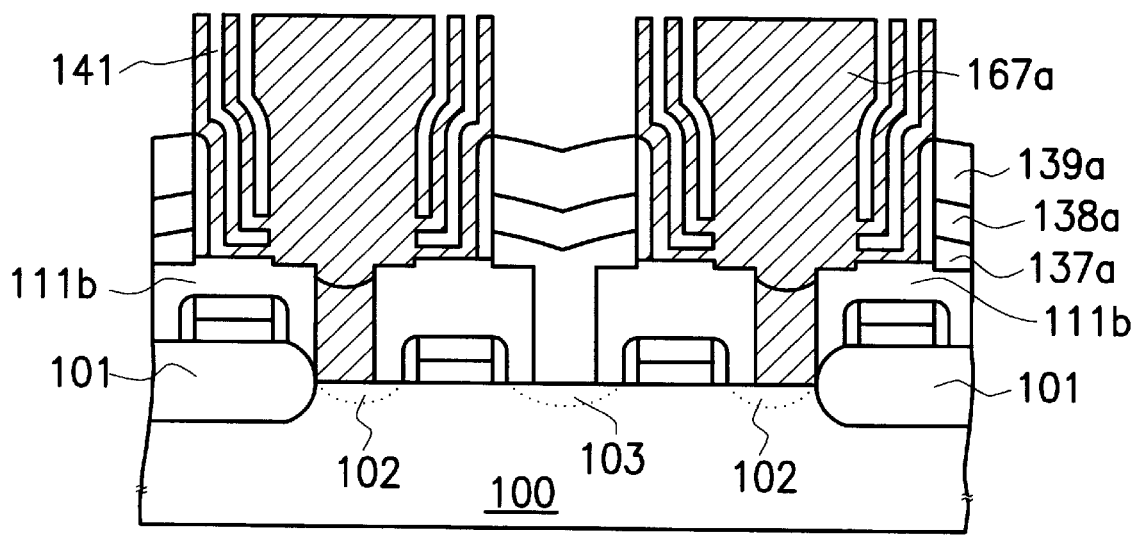

Referring further to FIG. 1M, in the subsequent step, a planarization process, preferably a chemical-mechanical polishing (CMP) process, is performed to planarize the top surface of the wafer until exposing the insulating layer 131a, the insulating layer 141a, and the insulating sidewall structure 151a. Through this process, a surface part of the polysilicon-based structure 167 is polished away (the remaining part is here designated by the reference numeral 167a for distinguishing purpose). The remaining polysilicon-based structure 167a then serves as the intended electrode structure. After this, the insulating layer 131a, the insulating layer 141a, and the insulating sidewall structure 151a are all entirely removed, preferably through an isotropic etching process, such as a wet-etching process. This completes the fabrication of the intended capacitor electrode structure.

All the subsequent process steps to complete the fabrication of the capacitor and the DRAM device are conventional techniques and not within the spirit and scope of the invention, so description thereof will not be further detailed. Beside the foregoing preferred embodiment, the invention is also applicable on embedded types of DRAM.

Figure 2:
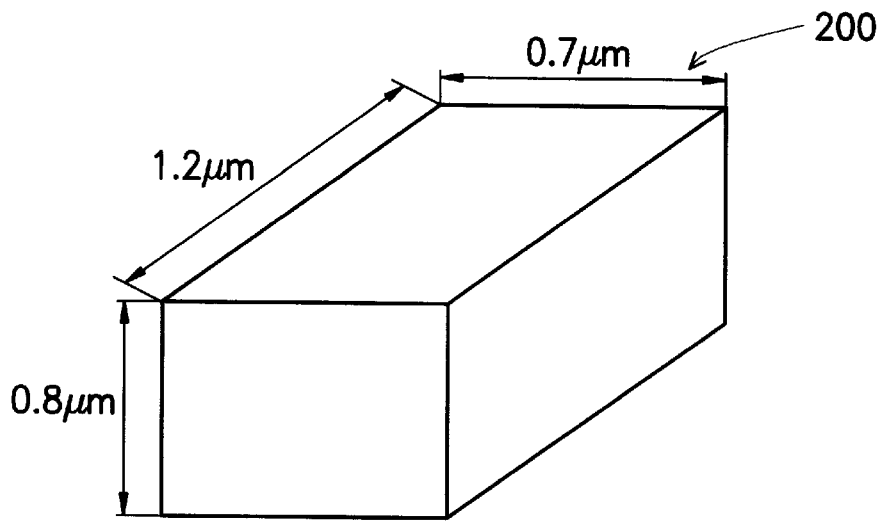
FIG. 2 is a schematic perspective diagram of the electrode structure of a conventional stack-type capacitor in DRAM.
Figure 3:
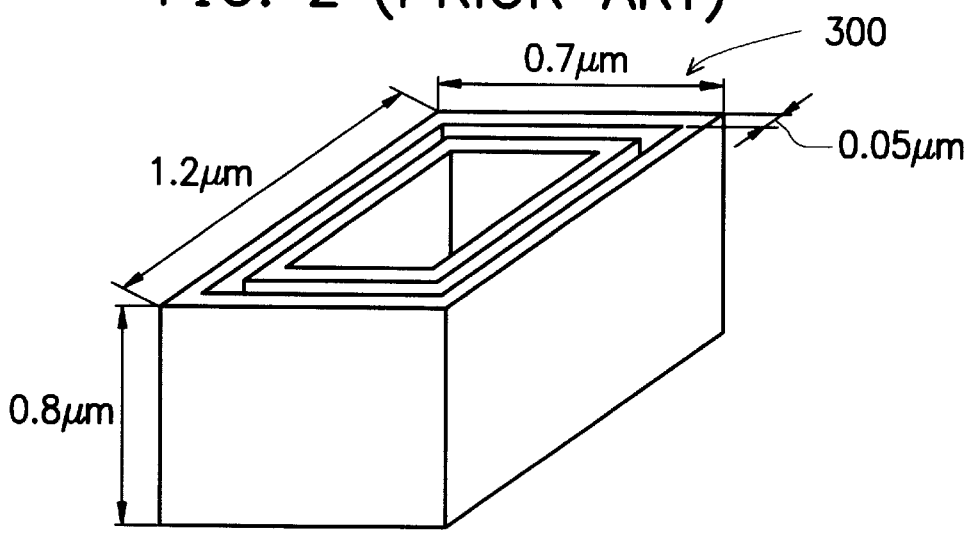
FIG. 3 is a schematic perspective diagram of the electrode structure of a patented double-crown type of capacitor in DRAM, which is disclosed in U.S. Pat. No. 5,688,713.
Figure 4:
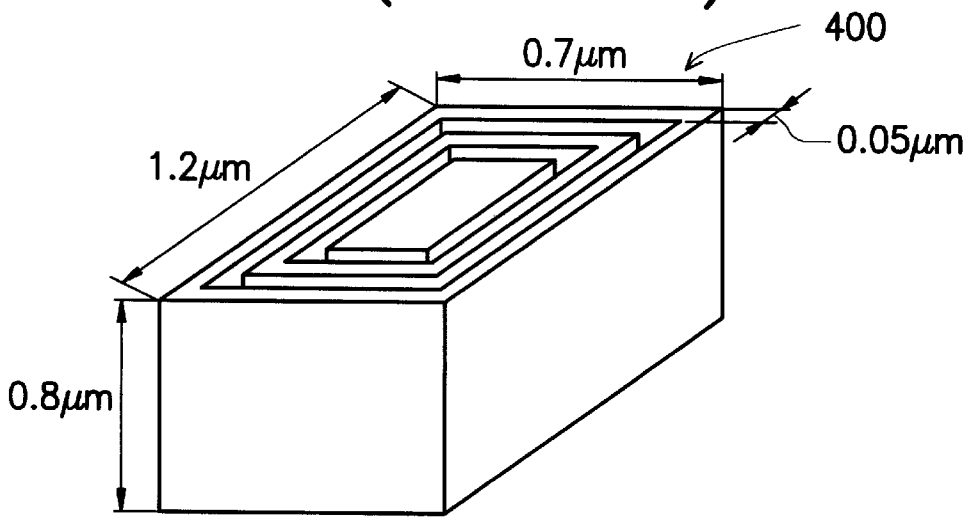
FIG. 4 is a schematic perspective diagram of the capacitor electrode structure according to the invention.

The improvement made by the invention over the prior art is more clearly depicted in the following with reference to FIGS. 2, 3, and 4. FIG. 2 is a schematic, perspective diagram of the electrode structure of a conventional stack-type data-storage capacitor in DRAM; FIG. 3 is a schematic, perspective diagram of the electrode structure of a patented double-crown type of data-storage capacitor in DRAM, which is disclosed in U.S. Pat. No. 5,688,713; and FIG. 4 is a schematic, perspective diagram of the capacitor electrode structure according to the invention. These three electrode structures are assumed to be equally dimensioned, for example 1.2 $\mu$m×0.7 $\mu$m×0.8 $\mu$m. Then, the conventional capacitor electrode structure 200 of FIG. 2 has a surface area of about 3.88 $\mu$m$^2$; and the conventional capacitor electrode structure 300 of FIG. 3 has a surface area of about 10.78 $\mu$m$^2$, while the capacitor electrode structure 400 made by the invention shown in FIG. 4 has a surface area of up to 12.43 $\mu$m$^2$. Since the capacitance of a capacitor is proportional to the surface area of its storage electrode, the invention undoubtedly can be used to make a capacitor having a considerably larger capacitance than the prior art.

In conclusion, the invention has the following advantages over the prior art.

(1) First, the invention allows the height difference between the memory cell region and the peripheral region to be eliminated, thus allowing the subsequent process steps to be easier to carry out than the prior art. This advantage is also valid when the invention is utilized in embedded types of DRAM.

(2) Second, the invention provides an electrode structure that allows the associated capacitor to be considerably increased in capacitance when compared to the prior art while requiring no increase in the layout area in the integrated circuit.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of fabricating a capacitor electrode structure in a DRAM device, comprising the steps of:

preparing a semiconductor substrate formed with a MOSFET having a first source/drain region and a second source/drain region;

forming a first insulating layer over the MOSFET;

forming a first polysilicon layer over the first insulating layer;

forming a plurality of openings in the first polysilicon layer at locations directly above the first and second source/drain regions of the MOSFET;

forming a polysilicon-based sidewall structure on the sidewall of each of the openings in the first polysilicon layer;

with the polysilicon-based sidewall structure and the first polysilicon layer serving as mask, performing an anisotropic etching process to etch away the exposed portions of the first insulating layer to thereby form a capacitor-node contact window to expose the first source/drain region and a bit-line contact window to expose the second source/drain region;

forming a second polysilicon layer over the first polysilicon layer, which fills up the capacitor-node contact windows and the bit-line contact window;

forming a metal silicide layer over the second polysilicon layer;

forming a second insulating layer over the metal silicide layer;

removing selected portions of the second insulating layer, the metal silicide layer, the second polysilicon layer, the first polysilicon layer, and the polysilicon-based sidewall structure other than those portions that lie directly above the second source/drain region, wherein the remaining portions in combination constitute a bit-line structure connected to the second source/drain region;

forming a first insulating sidewall structure on the sidewall of each bit-line structure;

forming a third insulating layer to cover the bit-line structure, with the third insulating layer being formed with an opening directly above the first source/drain region;

forming a third polysilicon layer over the third insulating layer, with the third polysilicon layer being conformal to the third insulating layer and coming into contact with the second polysilicon layer in the capacitor-node contact window;

forming a fourth insulating layer over the third polysilicon layer, with the fourth insulating layer being conformal to the third polysilicon layer;

forming a fourth polysilicon layer over the fourth insulating layer, with the fourth polysilicon layer being conformal to the fourth insulating layer;

forming a second insulating sidewall structure on the fourth polysilicon layer;

with the second insulating sidewall structure serving as mask, performing a first selective removal process to remove the exposed part of the fourth polysilicon layer and part of the fourth insulating layer until exposing the third polysilicon layer;

forming a fifth polysilicon layer which fills up the opening enclosed by the second insulating sidewall structure and comes into contact with the fourth polysilicon layer and the third polysilicon layer;

performing a second selective removal process to remove selected portions of the fifth polysilicon layer, the fourth polysilicon layer, and the third polysilicon layer until exposing the third insulating layer; and performing a third selective removal process to remove the third insulating layer, the fourth insulating layer, and the second insulating sidewall structure, wherein the fifth polysilicon layer, the fourth polysilicon layer, the third polysilicon layer, and the second polysilicon layer in combination constitute the intended capacitor electrode structure which is connected via the first polysilicon layer to the first source/drain region.

2. The method of claim 1, wherein the second insulating layer is formed from silicon nitride.

3. The method of claim 1, wherein the third polysilicon layer, the fourth polysilicon layer, and the forth insulating layer are each formed to a thickness of from 400 Å to 700 Å.

4. The method of claim 1, wherein the first insulating layer, the third insulating layer, the fourth insulating layer, and the second insulating sidewall structure are each formed from silicon oxide.

5. The method of claim 1, wherein the first insulating sidewall structure is formed from silicon nitride.

6. The method of claim 1, wherein the third insulating layer is formed to a thickness of from 7,000 Å to 9,000 Å.

7. The method of claim 1, wherein the first selective removal process is an anisotropic etching process.

8. The method of claim 1, wherein the second selective removal process is an anisotropic etching process.

9. The method of claim 1, wherein the third selective removal process is an isotropic etching process.

10. A method of fabricating a capacitor electrode structure in a DRAM device constructed on a semiconductor substrate already formed with a MOSFET having a first source/drain region and a second source/drain region, with the capacitor electrode structure being electrically connected to the first source/drain region; the method comprising the steps of:

forming a first insulating layer over the MOSFET;

forming a capacitor-node contact window and a bit-line contact window in the first insulating layer, with the capacitor-node contact windows exposing the first source/drain region and the bit-line contact window exposing the second source/drain region;

forming a second polysilicon layer over the first polysilicon layer, which fills up the capacitor-node contact windows and the bit-line contact window;

forming a metal silicide layer over the second polysilicon layer;

forming a second insulating layer over the metal silicide layer;

removing selected portions of the second insulating layer, the metal silicide layer, the second polysilicon layer, the first polysilicon layer, and the polysilicon-based sidewall structure other than those portions that lie directly above the second source/drain region, wherein the remaining portions in combination constitute a bit-line structure connected to the second source/drain region;

forming a first insulating sidewall structure on the sidewall of each bit-line structure;

forming a third insulating layer to cover the bit-line structure, with the third insulating layer being formed with an opening directly above the first source/drain region;

forming a third polysilicon layer over the third insulating layer, with the third polysilicon layer being conformal to the third insulating layer and coming into contact with the second polysilicon layer in the capacitor-node contact window;

forming a fourth insulating layer over the third polysilicon layer, with the fourth insulating layer being conformal to the third polysilicon layer;

forming a fourth polysilicon layer over the fourth insulating layer, with the fourth polysilicon layer being conformal to the fourth insulating layer;

forming a second insulating sidewall structure on the fourth polysilicon layer;

with the second insulating sidewall structure serving as mask, performing a first selective removal process to remove the exposed part of the fourth polysilicon layer and part of the fourth insulating layer until exposing the third polysilicon layer;

forming a fifth polysilicon layer which fills up the opening enclosed by the second insulating sidewall structure and comes into contact with the fourth polysilicon layer and the third polysilicon layer;

performing a second selective removal process to remove selected portions of the fifth polysilicon layer, the fourth polysilicon layer, and the third polysilicon layer until exposing the third insulating layer; and performing a third selective removal process to remove the third insulating layer, the fourth insulating layer, and the second insulating sidewall structure, wherein the fifth polysilicon layer, the fourth polysilicon layer, the third polysilicon layer, and the second polysilicon layer in combination constitute the intended capacitor electrode structure which is connected via the first polysilicon layer to the first source/drain region.

11. The method of claim 10, wherein the third polysilicon layer, the fourth polysilicon layer, and the fourth insulating layer are each formed to a thickness of from 400 Å to 700 Å.

12. The method of claim 10, wherein the first insulating layer, the third insulating layer, the fourth insulating layer, and the insulating sidewall structure are each formed from silicon oxide.

13. The method of claim 10, wherein the third insulating layer is formed to a thickness of from 7,000 Å to 9,000 Å.

* * * * *